United States Patent [19]

Chesebro et al.

[11] Patent Number: 4,632,724
[45] Date of Patent: Dec. 30, 1986

[54] VISIBILITY ENHANCEMENT OF FIRST ORDER ALIGNMENT MARKS

[75] Inventors: Donald G. Chesebro, Colchester; Robert W. Sweetser, Essex Junction, both of Vt.

[73] Assignee: International Business Machines Corporation, Armonk, N.Y.

[21] Appl. No.: 767,316

[22] Filed: Aug. 19, 1985

[51] Int. Cl.[4] .................. H01L 21/306; B44C 1/22; C03C 15/00; B29C 17/08
[52] U.S. Cl. ..................... 156/626; 156/643; 156/646; 156/648; 156/651; 156/653; 156/657; 156/659.1; 156/661.1; 156/662; 156/668; 204/192.32; 427/38; 427/43.1; 430/313; 430/317
[58] Field of Search .............. 156/626, 643, 646, 648, 156/651–653, 655, 657, 659.1, 661.1, 662, 668; 204/164, 192 EC, 192 E; 427/38, 39, 43.1; 430/313, 317

[56] References Cited

U.S. PATENT DOCUMENTS

| | | | |
|---|---|---|---|
| 4,125,418 | 11/1978 | Vinton | 156/626 X |
| 4,233,091 | 11/1980 | Kawabe | 156/626 X |
| 4,374,915 | 2/1983 | Ahlquist et al. | 430/22 |
| 4,487,653 | 12/1984 | Hatcher | 156/651 X |
| 4,575,399 | 3/1986 | Tanaka et al. | 156/643 X |

OTHER PUBLICATIONS

Protschka et al, "E-Beam Alignment Masks for Processing FET Planar Si Structures", *IBM Technical Disclosure Bulletin*, vol. 19, No. 11, Apr. 1977, pp. 4244–4245.

Helmeyer et al, "E-Beam Registration Mark Enhancement by Pyrocatechol Etch", *IBM Technical Disclosure Bulletin*, vol. 24, No. 9, Feb. 1982, pp. 4731–4732.

Frederick et al, "Process to Define E-Beam Registration Marks", *IBM Technical Disclosure Bulletin*, vol. 25, No. 9, Feb. 1983, pp. 4759.

*Primary Examiner*—William A. Powell
*Attorney, Agent, or Firm*—Mark F. Chadurjian

[57] ABSTRACT

A method of enhancing first order alignment marks formed in the respective layers of a processed semiconductor wafer in which critical masking steps are carried out. After a given mark is formed, it is tested for visual contrast. If the contrast is insufficient to provide adequate alignment, a block mask is formed on the critical mask. The block mask exposes all of the alignment target areas and protects the product regions of the wafer, and the critical mask only exposes the mark to be enhanced. The mark is then etched for a time period which is a function of the measured visual contrast. This method of selectively enhancing selected ones of the first order alignment marks greatly enhances the utility of such marks, increasing the accuracy of critical masking steps.

10 Claims, 3 Drawing Figures

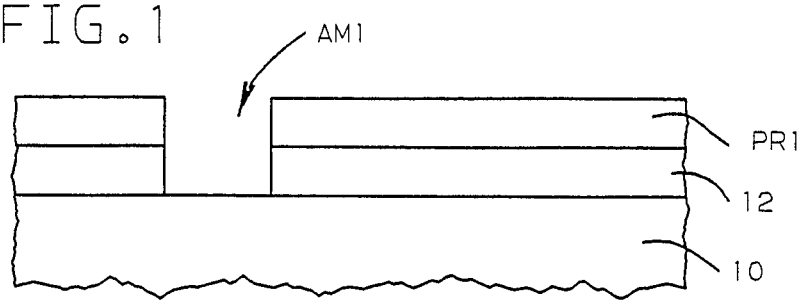
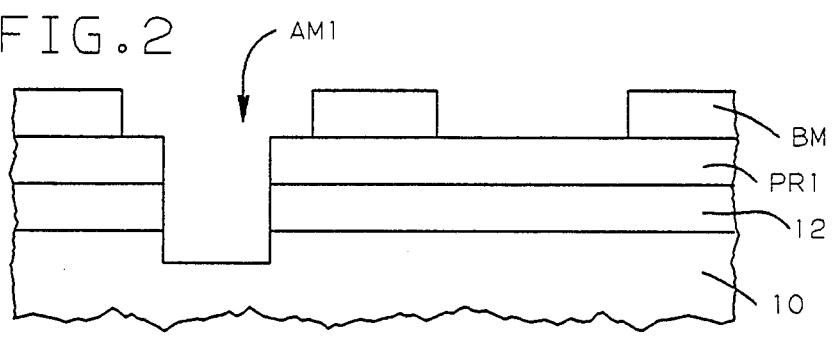
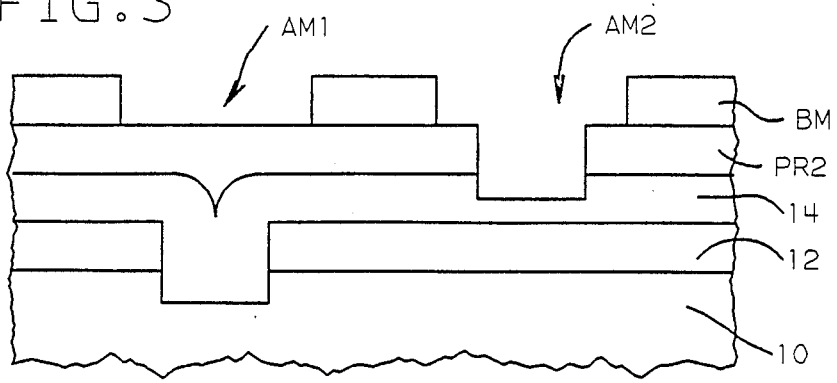

VISIBILITY ENHANCEMENT OF FIRST ORDER ALIGNMENT MARKS

BACKGROUND OF THE INVENTION

(1) Technical Field

The invention relates to a method of enhancing the alignment between the layers of a semi-conductor product.

(2) Background Art

In semiconductor manufacture, it is generally known that alignment must be maintained between the "critical masking steps" that are carried out on respective layers of a semiconductor product. "Critical masking steps" are those process steps (e.g. etching, implantation, etc.) carried out through masks which must be aligned with respect to one another. Misalignment between these masking steps seriously degrades the reliability of the process to perform its intended function.

Previous solutions to this problem have involved the use of alignment marks referred to as "bench marks". These marks are apertures formed in the surface of the semiconductor substrate. All subsequent masking steps are aligned with respect to these bench marks.

More recently, the industry has found that the bench mark alignment system does not provide enough accuracy as device dimensions are reduced. Assume that four critical masking steps are used in a given process. Since the fourth mask is directly aligned to the bench mark, it is only indirectly aligned to the other masking steps. For example, if it were necessary to align the fourth masking step with respect to the second masking step, only a "second order alignment" would be obtained. That is, the direct (i.e. "first order") alignment between these two masking steps depends upon the accuracy of the alignment between each of two masking steps and the bench marks. It has been found that any alignment below a first order alignment (i.e. a direct alignment between the desired masking steps) greatly degrades the density of the aligned structures.

In general, first order alignment can be maintained by forming alignment marks in the layers upon which the critical masking steps are carried out. If an oxide layer is grown on the substrate, a groove or similar surface discontinuity can be formed therein to form an alignment mark indicative of the positioning of a critical masking step (e.g an etch through a mask) carried out on the oxide. The next critical masking step in the process is then aligned with respect to the alignment mark in the oxide. Similarly to conventional bench marks, these "first order alignment marks" are formed at a peripheral location on the wafer removed from the product regions, such as a kerf region.

The inventors encountered difficulties when they attempted to use first order alignment marks in automatic alignment systems. These alignment tools require high visibility contrast between the alignment marks and the layers in which they are formed. In general, the visibility contrast is a function of the light diffraction/reflection properties of the given layer(s), as well as the light transmissive properties of any surrounding layers, which in turn are related to the thickness and composition of these layer(s). Contrast can also be adjusted by controlling the depth and sidewall topography of the alignment marks which are formed in the layer.

This latter approach is known in the art for enhancing the visibility contrast of conventional bench marks. See e.g. U.S. Pat. No. 4,374,915 (issued 2/22/83 to Ahlquist et al and assigned to Intel Corp.). After the bench marks are formed in the substrate, the bottom surfaces of the marks are roughened in order to scatter incident light and thus increase visibility contrast between the marks and the substrate. The bottom surface of the marks is etched through the same photoresist mask which is used to create the marks in the substrate. Note that this process is non-selective; that is, all of the alignment marks are enhanced simultaneously and to an equal extent. A similar process is shown in an article by Helmeyer at al "E-Beam Registration Mark Enhancement By Pyrocatechol Etch", IBM Technical Disclosure Bulletin, Vol. 24, No. 9, Feb. 1982, pp. 4731–4732.

The above processes are inappropriate for first order alignment marks. For these marks, an enhancement process is needed which can selectively enhance selected ones of the marks. That is, while some marks may require little or no enhancement, others may require a great deal of enhancement. For example, a critical masking step may be carried out which does not include etching into the underlaying layer (e.g. implantation). In this case, an extra etch would have to be performed to form the first order alignment mark in this layer. The above-described processes do not provide such a selective enhancement capability.

SUMMARY OF THE INVENTION

Accordingly, it is an object of the present invention to enhance the alignment between the critical masking steps which are used to form semiconductor devices.

It is another object of the invention to provide a method of selectively enhancing alignment marks formed in selected layers.

It is yet another object of the invention to provide a method of selectively enhancing selected ones of the first order alignment marks formed in respective ones of the layers upon which critical masking steps are carried out.

These and other objects of the present invention are realized by a process which selectively enhances selected ones of the first order alignment marks. After a given first order alignment mark is etched in a layer, it is tested for visibility contrast. If enhancement is needed, a block mask is deposited having aperatures which define the relative positions of all of the alignment marks. The given alignment mark is then etched through the block mask in order to enhance its visibility contrast with respect to the surface of the layer within which it is formed. If the given masking step does not involve etching, this subsequent etch forms the alignment mark. Since only one mark is processed at a time, each mark can be selectively etched. The process is repeated in sequence, for all of the marks which need enhancement, as each mark is formed.

BRIEF DESCRIPTION OF THE DRAWING

The foregoing and other structures and teachings of the present invention will become more apparent upon description of the best mode for carrying out the invention as rendered below. In the description to follow, reference will be made to the accompanying drawing, in which:

FIG. 1 is a cross-sectional view of a substrate having a first order alignment mark formed thereon;

FIG. 2 is a cross-sectional view of the substrate of FIG. 1 in which the first order alignment mark is enhanced; and FIG. 3 is a cross-sectional view of the substrate of FIG. 2 in which a subsequent alignment mark is formed and processed in accordance with the invention.

BEST MODE FOR CARRYING OUT THE INVENTION

With reference to FIG. 1 of the accompanying drawings, a silicon dioxide layer 12 is formed (by thermal growth in an oxidizing ambient or by pyrolytic deposition) on an exposed surface of a silicon wafer 10. The illustrated structure is formed on a kerf region of the wafer which has been set aside for forming alignment marks, and it undergoes the same processing steps that are carried out on the remainder of the wafer. The process discussed here is given for illustrative purposes only. For example, layer 12 could be a layer of any other material used to form semiconductor device structures.

Assume that the first critical masking step of the process is the etching of selected areas of oxide layer 12. A photoresist layer PR1 is formed on the oxide layer 12. In the product regions of the wafer, the photoresist is patterned to expose the selected areas of oxide 12 which are to be etched. In the alignment mark kerf area of the wafer, a single area of the oxide 12 is exposed through photoresist PR1. The exposed area of the oxide in the kerf region is then etched along with the selected areas in the product regions. In the kerf region, an alignment mark AM1 is thus formed in oxide 12. The next critical masking step of the process can now be aligned with respect to alignment mark AM1 in oxide 12. In this example, any etch system could be used which has a high etch ratio of silicon dioxide to photoresist. An example of such an etch system is a RIE etch in a carbon tetrafloride ($CF_4$) atmosphere. Other etchants which could be used here include floroform (CHF3) nitrogen trifluoride ($NF_3$) or $CF_4$ with a small amount of oxygen or carbon dioxide.

After alignment mark AM1 is formed, it is tested for visual contrast. If the mark provides adequate contrast, the process is continued without interruption. In testing contrast, the light used for alignment purposes is directed onto the alignment mark area of the wafer. If the detection system can adequately distinguish between alignment mark AM1 and the surrounding surface of oxide 12, the following enhancement routine is not initiated. The "detection system" here could be either a manual inspection or an optical monitor of an automatic alignment tool.

Assume that the visual contrast of AM1 to the upper surface of oxide 12 is inadequate to provide accurate alignment for the next critical masking step. As shown in FIG. 2, a block mask BM is provided on the surface of the photoresist PM1. The block mask is a layer of photoresist which is exposed to form a pattern which corresponds to all of the areas of the alignment region of the kerf in which alignment marks either have been or are to be formed (both of which are referred to hereinafter as "alignment targets"). The same block mask pattern is used to selectively enhance any of the alignment targets. The block mask protects the product regions during the enhancement etch. Note that the openings in block mask BM are wider than those in the underlaying photoresist PR1. This is done in order to allow for a degree of misalignment between the two masking layers. Note also that photoresist PR1 is not removed prior to forming block mask BM. This is because photoresist PR1 is used to protect the alignment targets which are not to be etched during the enhancement etch.

As shown in FIG. 2, the alignment mark AM1 is then etched further through block mask BM1 in order to enhance its visual contrast with respect to oxide layer 12. The extent of the enhancement etch should be a function of the lack of visual contrast presented by the alignment mark. This has the effect of selectively increasing the depth of the alignment mark, which increases the phase difference between light reflected from the alignment mark and light reflected from the surrounding layer surface. In FIG. 2, the enhancement etch is continued until a small step is created in the underlaying silicon 10. The enhancement etchant should have a substantially vertical directional component (i.e. it should form substantially vertical sidewalls), and it should etch the underlaying layers (e.g. oxide and silicon) without appreciably attacking the photoresist. An example of such an etch is a RIE in a $CF_4$ atmosphere. Other etchants could be used. Note that this etch system is the same as that used to form the alignment marks during etching of the product regions. In general, if a given critical masking step includes an etch step, the same etchant can be used to perform the enhancement etch unless the enhancement etch exposes an underlaying layer which does not etch in this etchant.

After the enhancement etch is completed, the block mask BM is removed using any conventional photoresist removal technique (e.g. plasma stripping in an oxygen atmosphere). If desired, the removal step can be continued to remove the underlaying photoresist PR1.

Wafer processing is then continued until the next critical masking step. As previously stated, this masking step is aligned to the wafer by reference to first order alignment mark AM1. Assume that a second oxide layer 14 has been deposited, and that dopant ions are to be implanted through the two oxide layers 12 and 14 to preselected areas of the underlaying silicon 10. As shown in FIG. 3, a photoresist PR2 is formed and patterned as was photoresist PR1. However, note that this process step involves implantation rather than etching. Therefore, if there was no method of providing an enhancement etch, a first order alignment mark indicating the relative position of this critical masking step would not be formed.

Accordingly, the same photoresist block mask BM used previously is formed on photoresist PR2, and an enhancement etch is carried out to form a first order alignment mark AM2. Note that the photoresist PR2 protects the alignment mark AM1 from further etching.

This process of forming alignment marks and selectively enhancing selected ones of the marks is continued throughout the wafer processing. This process results in a plurality of high-contrast alignment marks which provide alignment to the desired order. For example, the next critical masking step can be aligned with respect to either AM1 or AM2.

It is to be understood that while modifications or other alteration to the structures and teachings of the present invention as described above may occur to a person of ordinary skill in the art, such changes fall within the spirit and scope of the present invention as recited in the claims appended hereto.

We claim:

1. A method for providing first order alignment between sequential critical masking steps used to process layers formed on a semiconductor substrate, comprising the steps of:

forming alignment marks on respective ones of said layers upon which respective ones of said critical masking steps are carried out, said alignment marks being formed as said layers are etched through critical masks used in said respective critical masking steps; and selectively enhancing selected ones of said alignment marks by etching said alignment marks through a block mask for a predetermined period of time.

2. The method as recited in claim 1, wherein said block mask exposes all of said alignment target areas in said discrete region while protecting all of said selected areas in said product region, said alignment mark to be enhanced being exposed by both of said block mask and said critical mask, and wherein after said step of etching said alignment marks through sadi block mask and said critical mask for a predetermined time, both of said block mask and said critical mask are removed during the course of a single removal step.

3. The method as recited in claim 2, wherein said step of enhancement etching comprises a reactive ion etch in a carbon tetrafluoride atmosphere.

4. The method as recited in claim 2, wherein said alignment mark is tested for visual contrast prior to forming said block mask and etching said alignment mark, and wherein said predetermined time of said etch is a function of said visual contrast.

5. A method of providing a plurality of first order alignment marks for maintaining a first order alignment between sequential ones of a plurality of critical masking steps included in the processing of a semiconductor substrate, including the steps of:

(a) forming a critical mask on an exposed surface of a given layer;

(b) etching through said critical mask to remove desired areas of said layer in product regions of said substrate and to form at least one alignment mark in a discrete region of said substrate;

(c) forming a block mask on said critical mask to protect said product regions of said substrate and to expose areas of said discrete region of said substrate in which all of said plurality of first order alignment marks are to be formed;

(d) etching said at least one alignment mark through said block mask and said critical mask for a predetermined period of time, in order to enhance visual contrast between said alignment mark and adjacent portions of said layer;

(e) removing said block mask and said critical mask during the course of a single removal step; and (f) repeating steps (a) through (e) for the remainder of said plurality of critical masking steps in said process.

6. A method of selectively enhancing the visual contrast of selected ones of first order alignment marks formed in respective layers in which critical masking steps are carried out, comprising the steps of testing an alignment mark for visual contrast, forming a block mask over a layer in which said alignment mark is formed when said visual contrast is insufficient to allow accurate alignment, and etching said alignment mark through said block mask for a time period which is a function of said measured visual contrast.

7. The method as recited in claim 6, wherein said block mask is formed on a critical mask through which said critical masking step is carried out on said layer.

8. The method as recited in claim 7, wherein said block mask has openings which are wider than those of said critical mask, in order to allow for misalignment between said critical mask and said block mask.

9. The method as recited in claim 8, wherein said block mask and said critical mask are subsequently removed during the course of a single removal strip step.

10. A method of selectively enhancing a first order alignment mark formed in layers of a processed semiconductor wafer which are subjected to critical masking steps, comprising the steps of:

testing the visual contrast presented by a given first order alignment mark prior to forming a subsequent first order alignment mark;

forming a block mask on a surface of a critical mask through which said first order alignment mark was formed if said visual contrast is insufficient to permit accurate alignment, said block mask protecting product regions of said substrate and said critical mask protecting areas of a discrete region of said substrate in which prior first order alignment marks and future alignment mark sites are disposed; and etching said given first order alignment mark in an etch which was used to form said alignment mark through said critical mask.

* * * * *